(12) United States Patent
Golliver et al.

(10) Patent No.: US 6,249,798 B1
(45) Date of Patent: Jun. 19, 2001

(54) METHOD, APPARATUS AND COMPUTER SYSTEM FOR DIRECTLY TRANSFERRING AND TRANSLATING DATA BETWEEN AN INTEGER PROCESSING UNIT AND A FLOATING POINT PROCESSING UNIT

(75) Inventors: Roger A. Golliver, Beaverton, OR (US); Michael James Morrison, Santa Clara, CA (US); Glenn Colon-Bonet, Fort Collins, CO (US); Guatam Bhawandas Doshi, Sunnyvale, CA (US); Jerome C. Huck; Alan Hersh Karp, both of Palo Alto, CA (US); Sivakumar Makineni, Sunnyvale, CA (US)

(73) Assignee: Institute for the Development of Emerging Architectures, L.L.C., Cupertino, CA (US)

( * ) Notice: Subject to any disclaimer, the term of this patent is extended or adjusted under 35 U.S.C. 154(b) by 0 days.

(21) Appl. No.: 08/728,646

(22) Filed: Oct. 10, 1996

(51) Int. Cl.[7] ........................................ G06F 7/38
(52) U.S. Cl. ............................. 708/490; 708/524
(58) Field of Search ................ 364/736.01, 736.04, 364/748.01, 748.13, 715.03; 708/490, 524, 504, 507, 204

(56) References Cited

U.S. PATENT DOCUMENTS

| | | | |
|---|---|---|---|
| 4,833,599 | * 5/1989 | Colwell et al. | 395/800.24 |
| 4,949,291 | 8/1990 | Saini | 364/715.03 |
| 5,235,533 | 8/1993 | Sweedler | 364/715.03 |
| 5,257,215 | 10/1993 | Poon | 364/745 |
| 5,268,855 | * 12/1993 | Mason et al. | 364/748.13 |
| 5,367,650 | 11/1994 | Sharangpani et al. | 395/375 |
| 5,523,961 | 6/1996 | Naini | 364/715.03 |
| 5,619,198 | * 4/1997 | Blackham et al. | 708/204 |
| 5,805,486 | * 9/1998 | Sharangpani | 708/524 |

OTHER PUBLICATIONS

IBM, Tech. Discl. Bull., vol. 38, No. 04 Apr. 1995, pp. 417–419, Unique Implementation for 64–Bit integer to Floating Conversion.*

* cited by examiner

Primary Examiner—Tan V. Mai
(74) Attorney, Agent, or Firm—Kenyon & Kenyon

(57) ABSTRACT

An apparatus, a processor, a computer system and a method may be used to directly transfer and translate data between a memory format in an integer processing unit and a floating point format in a floating point processing unit. Data is stored in integer registers of the integer processing unit in a memory format and is stored in floating point registers of the floating point processing unit in a floating point format. A direct data link is provided between the integer register file of the integer processing unit and the floating point register file of the floating point processing unit. The direct data link includes a logic circuit which translates data between the memory format and the floating point format.

30 Claims, 11 Drawing Sheets

METHOD, APPARATUS AND COMPUTER SYSTEM FOR DIRECTLY TRANSFERRING AND TRANSLATING DATA BETWEEN AN INTEGER PROCESSING UNIT AND A FLOATING POINT PROCESSING UNIT

RELATED APPLICATIONS

This application is related to application entitled "Moderately Coupled Floating Point and Integer Units"; Inventor: Harshvardhan Sharangpani; Ser. No. 08/563,499; Filed: Nov. 28, 1995 and issued as U.S. Pat. No. 5,805,486. This application is also related to application entitled "Method of Transferring Data Between Moderately Coupled Integer and Floating Point Units"; Inventor: Harshvardhan Sharangpani; Ser. No. 08/563,682; Filed: Nov. 28, 1995 and issued as U.S. Pat. No. 5,548,284. Each of these applications is incorporated herein by reference in their entirety.

BACKGROUND OF THE INVENTION

The present invention relates to a transfer and translation of information between an integer processing unit and a floating point processing unit. More particularly, the present invention relates to direct transfer between and translation of data stored in a memory format in integer registers of the integer processing unit and data stored in a floating point format in floating point registers of the floating point processing unit.

The use of integer and floating point processing units within or in conjunction with a microprocessor is well known in the data processing art. The integer processing unit provides the basic arithmetic and logical operations for the processor when the information is in integer format and the floating point processing unit provides the basic arithmetic and logical operations for the processor in floating point format when floating point operations are to be performed. Typically, there are two sets of registers including a first set of integer registers for the integer unit and a second set of floating point registers for the floating point unit. Further, the bit length of the two register sets may differ in order to accommodate the higher precision capability of the floating point unit. For example, the integer registers may each be 32 bits in length, while the floating point registers may each be 64 bits or greater.

In current microprocessor technology, a typical integer unit includes a number of integer registers which store information and one or more integer execution units which operate on the stored information based on instructions conveyed to the execution unit(s). The integer registers for the integer unit are sometimes collectively referred to as a file (e.g., a register file, an integer register file or an integer file). In addition to the integer execution unit(s), the integer register files are also coupled to a bus for transfer of information to other units, such as memory. Thus, information can be loaded from memory to the integer register file, operated on by one or more integer execution unit (which calculation is returned to the register file) and the result ultimately stored back in the memory.

The floating point processing unit is configured similarly to the integer processing unit in that it also includes a number of registers which load and store information from other units such as memory. The floating point processing unit includes one or more execution units which operate based on floating point instructions. An advantage of a floating point unit is its ability to provide support for complex numerical and scientific calculations on data in floating point format.

In the course of numeric computation, it is often necessary to perform operations that resemble integer manipulation on floating point values, and it is occasionally necessary to perform operations that resemble floating point manipulation on integer values. Thus, a typical operation is to transfer particular data from one unit to the other, perform the computation, and then return the resultant data to the first unit. Some examples of such operations that couple floating point computation to integer computation are noted below. It should be appreciated that these examples are not the only operations that couple floating point and integer computations. Therefore, these examples are provided herein for illustration purposes only.

1) Exponent operation: Adding an integer value to an exponent of a floating point number to scale the number.

2) Sign operation: Reversing the sign of a number.

3) Mantissa operation: Inserting or deleting bits by OR'ing in (also referred to as "jamming") explicit 1s (ones) or AND'ing in (also referred to as "jamming") explicit 0s (zeros) into any of the mantissa positions in order to clamp a number to a certain defined value.

4) Boolean operation: Compounding Boolean values generated as a result of integer compares, as well as floating point compares.

5) Inter-conversion operation: Multiplying a floating point value with an integer value currently in the integer register file, which will require the movement of the integer value to the floating point register file and converting or translating it into floating point format.

In present microprocessors, single precision calculations have been performed on a single precision data format, which has been defined as having a bit length of 32 bits. The single precision data format includes 23 significand bits, 8 exponent bits and one sign bit. Additionally, a double precision data format has previously been implemented using a bit length of 64 bits. The double precision data format includes 52 significand bits, 11 exponent bits and one sign bit. Floating point operations have typicallly been performed on data in the double precision data format. Accordingly, integer register files have included integer registers of 32 bits in length, while floating point register files have included registers of 64 bits in length. The manipulation of single and double precision formats was simplified by the fact that the double precision format was exactly twice the length of the single precision format.

However, some microprocessors have extended the floating point capability to more than double precision. One microprocessor family developed by Intel Corporation (e.g., the 80386, 80486 and Pentium™ microprocessors) use an extended precision floating point format. The extended precision is an extension of the 64 bit double precision format and conforms to ANSI/IEEE (American National Standards Institute/The Institute of Electrical and Electronics Engineers) Standard 754 (1985), which is titled "IEEE Standard for Binary Floating-Point Arithmetic". The extended precision format has been defined to have a bit length of 80 bits. However, while the floating point data format might have a bit length of 80 bits to accommodate the extended precision format, it is possible for future floating point formats to have a larger number of bits (e.g., 82 or more bits).

A current trend in microprocessor design is to extend the integer registers to have a bit length of 64 bits. Such a design requirement is prerequisite for microprocessors utilizing a 64-bit architecture (64 bits of addressing and data). Thus, integer units will utilize integer registers having 64 bits in length, while floating point units will utilize floating point registers having 80 bits or more bits in length (e.g., 82 bits in length). Accordingly, coupling of the integer register files of the integer processing unit and the floating point register files of the floating point processing units will involve transfers between 32 or 64 bit single or double precision memory format data values and 80 or 82 bit floating point format data values.

The above-mentioned copending applications disclose techniques for providing coupling between integer and floating point units. The coupling arrangements of these applications are referred to as "moderately coupled", since the arrangement provides more coupling than a fully decoupled scheme, but less coupling than a fully coupled scheme. Although the arrangements of these applications disclose advantageous "moderately coupled" arrangements between the integer unit and the floating point unit, they do not address any data format translation between the memory format in which data are stored in the integer unit and the floating point format in which data are stored in the floating point unit. Thus, there is a need to provide a translation method to enhance the overall efficacy of the arrangements disclosed in the above-mentioned applications. Additionally, although these arrangements provide for transfer of double-extended memory format data and floating point format data between the integer unit and the floating point unit, no support is provided for direct transfers involving single precision memory format data and double precision memory format data between the integer unit and the floating point unit. Further, although logic circuits have previously been contemplated to translate between memory format data and floating point format data, a need has arisen to translate between a memory format and a floating point format in conjunction with a direct data transfer between an integer processing unit and a floating point processing unit.

SUMMARY OF THE INVENTION

The present invention provides for direct transfer and translation of data between memory format data in an integer processing unit and floating point data in a floating point processing unit. According to a feature of the present invention, a direct data link is provided between integer registers of the integer processing unit and floating point registers of the floating point processing unit. Moreover, a logic circuit is arranged in the direct data link which translates data between the memory format (or memory formats) used in the integer registers and the floating point format used in the floating point registers as it is transferred between the integer registers and the floating point registers.

In this manner, the present invention provides direct transfer and translation between memory format data stored in the integer registers and floating point data stored in the floating point registers. The present invention provides a data translation between memory format and floating point format without significant delays. That is, since the present invention provides a direct transfer and data translation between the integer processing unit and the floating point processing unit, data translation and transfer can be implemented quickly and economically.

DETAILED DESCRIPTION

A direct data link providing data transfer and translation between a floating point processing unit and integer processing unit which may be used in a processor is described herein. In the following description, numerous specific details are set forth, such as specific registers, arithmetic and logic execution units, bit length formats for data words, etc., in order to provide a thorough understanding of the present invention.

It is noted that the use of integer and floating point processing units for providing arithmetic and logical calculations is well known in the art. These units can be configured separately from a microprocessor to provide the arithmetic (or logical) operations on data. However, it is generally understood that "state-of-the-art" microprocessors will include both of these units as part of the microprocessor "chip". Additionally, it is further understood that data stored in some form of memory will be accessed by one or both of these numeric units.

It may be necessary to perform calculations that resemble integer manipulation on a floating point value and floating point manipulation on an integer value. Thus, it is beneficial for a particular data type in one numeric unit to be operated on in the other numeric unit, or vice versa, as discussed above.

Figure 1:
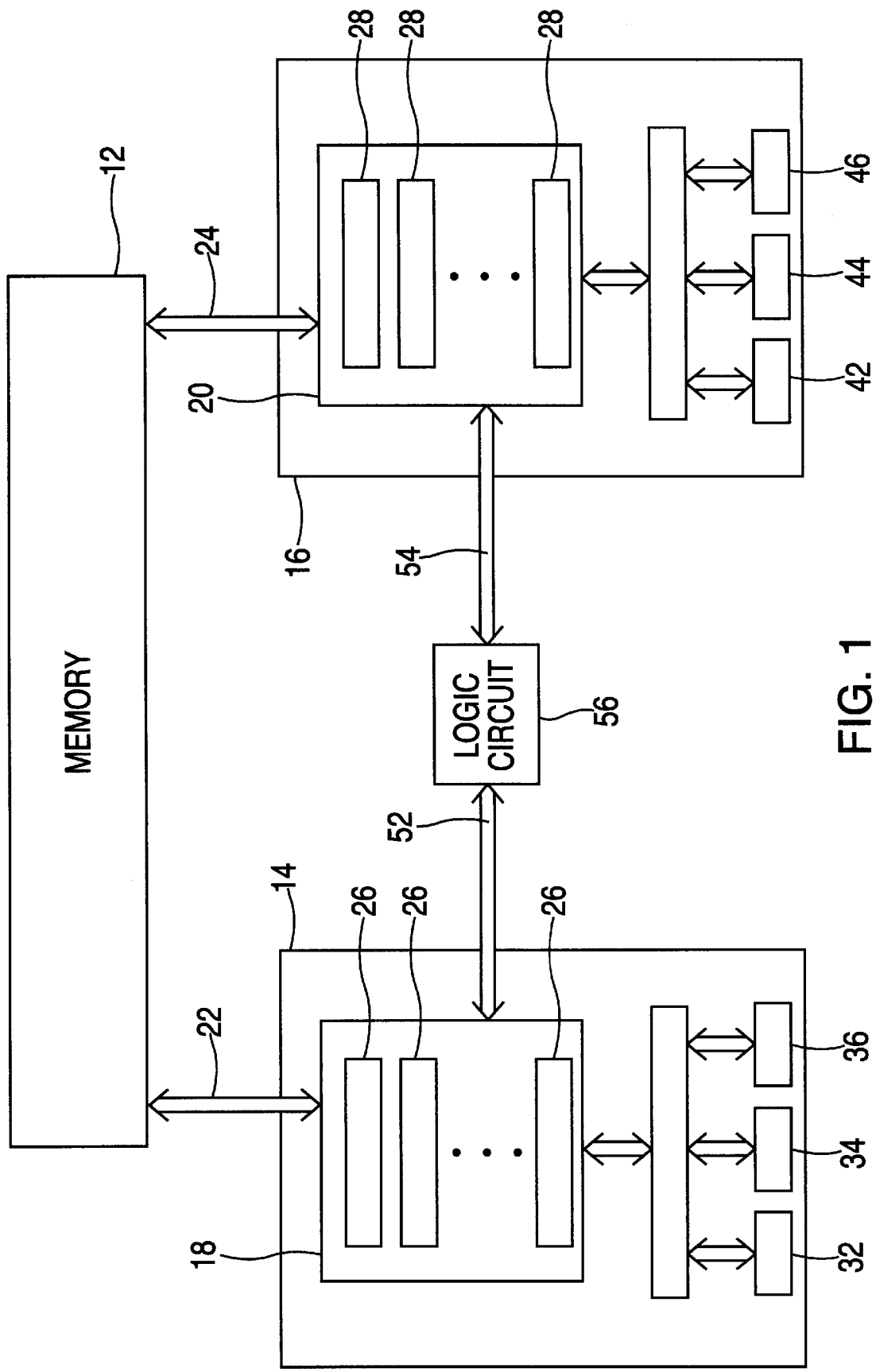
FIG. 1 illustrates an arrangement for direct data transfer and translation between an integer processing unit and a floating point processing unit according to an exemplary embodiment of the present invention.

FIG. 1 illustrates an arrangement for direct data transfer and translation between data in a memory format in an integer processing unit and data in a floating point format in a floating point processing unit according to an exemplary embodiment of the present invention. FIG. 1 includes a memory 12, an integer processing unit 14 and a floating point processing unit 16.

The integer processing unit 14 includes an integer register file 18, which is coupled to memory 12 by a bus 22. The integer processing unit 14 is utilized to provide operations other than floating point operations. The floating point processing unit 16 is separate from the integer processing unit 14 and is utilized to provide all floating point operations. The floating point processing unit 16 includes a floating point register file 20, which is also coupled to memory 12 by a bus 24. Thus, data is moved between memory 12 and the register file 18 by bus 22 and between memory 12 and register file 20 by bus 24. It is generally understood that buses 22 and 24 may actually be the same single bus coupling memory 12 to both integer processing unit 14 and floating point processing unit 16.

It should also be appreciated that well-known components and units associated with a microprocessor are not shown in FIG. 1, since the understanding of those units (such as, for example, a bus interface unit) are not essential to the understanding of the present invention. Furthermore, it should be understood that although only one memory is shown, memory 12 of FIG. 1 can include multiple or different memories. For example, it is typical in a computer system to have at least one level of cache memory (usually resident on the processor chip), a RAM (random access memory) main memory and non-volatile mass storage memory (such as a magnetic storage media). Thus, memory 12 can represent any one or all of these memory devices. Additionally, the single bus including bus 22 and bus 24 may actually be more than a single bus, such as in the instance where multiple bus levels are used to couple data to and from memory 12 if memory 12 is configured to be distant from the integer register files 18 and the floating point register files 20.

Both register files 18 and 20 each include a plurality of registers 26 and 28, respectively. Although the actual number of such registers is a design choice, it is typical to have a number of registers equal to an exponential value of two. Accordingly, it is typical to have 32 or 64 such registers in each of the register files 18 and 20. In the illustrated embodiment, there are 32 integer registers 26 in the integer register file 18 and 32 floating point registers 28 in the floating point register file 20.

Similarly, the bit-length of the registers is also a design choice dependent on the processor architecture. Although 32-bit registers can be readily utilized, integer registers 26 of FIG. 1 are 64-bit registers in order to provide larger addressing capability. Since it is anticipated that addresses and data transfers to and from memory 12 will be accomplished utilizing a 64-bit architecture with the newer generations of microprocessors, the arrangement of FIG. 1 adapts to this newer convention. The floating point registers 28 of FIG. 1 are 82 bits in length in order to accommodate the floating point register format. Although the floating point registers are described herein as being 82 bits in length, the size (or bit length) of the floating point registers is a design choice and any floating point register bit length may be used in implementing the present invention.

A plurality of integer execution units 32, 34 and 36 are coupled to the integer register file 18. Although only three integer execution units 32, 34 and 36 are illustrated in FIG. 1, the actual number of integer execution units is a design choice. Likewise, a plurality of floating point execution units 42, 44 and 46 are coupled to the floating point register file 20. Although only three such floating point execution units 42, 44 and 46 are illustrated in FIG. 1, the actual number is a design choice. How these execution units are utilized is also a design choice. For example, execution unit 42 can be for floating point addition, execution unit 44 can be for floating point multiplication and execution unit 46 can be for floating point division. It is to be noted that the execution units of each numeric processing unit (integer or floating point) are not shared by the other numeric processing unit. Thus, integer execution units 32, 34 and 36 are isolated from the floating point processing unit 16, while floating point execution units 42, 44 and 46 are isolated from the integer processing unit 14.

A direct data link including a bi-directional bus 52, a bi-directional bus 54 and a logic circuit 56 is used as a coupling for direct data transfer and translation between the two register files 18 and 20. That is, integer registers 26 are coupled to floating point registers 28 by the direct data link. All data transfers between the two register files 18 and 20 are accomplished as direct transfers on the direct data link including bus 52, bus 54 and logic circuit 56. Additionally, logic circuit 56 translates data between the memory formats of the integer registers 26 and the floating point format of the floating point registers 28.

As described above, in FIG. 1, all floating point operations are performed in the floating point processing unit 16 while other operations, including integer operations, are performed in the integer processing unit 14. Whenever an operation requires a data transfer from one numeric processing unit to the other, data stored in one of the integer register files 18 or the floating point register files 20 is directly transferred to the register file of the other numeric processing unit through the direct data link including bi-directional bus 52, bi-directional bus 54 and logic circuit 56. Bus 52 includes a 64-bit bi-directional data bus transferring data between the integer register files 18 and the logic circuit 56. Bus 54 includes an 82-bit bi-directional data bus transferring data between floating point registers 20 and logic circuit 56. Logic circuit 56 translates data between the 82-bit floating point data format and the 32-bit single precision memory format and between the 82-bit floating point data format and the 64-bit double precision memory format.

It is noted that buses 52 and 54 could include additional bits used as control signals input to logic circuit 56 to identify the particular data format translation to be implemented in logic circuit 56. Alternatively, input control signals could be provided from the integer processing unit and/or the floating point processing unit separate from the buses 52 and 54, or may be provided from elsewhere within the microprocessor, for example.

Figure 2:
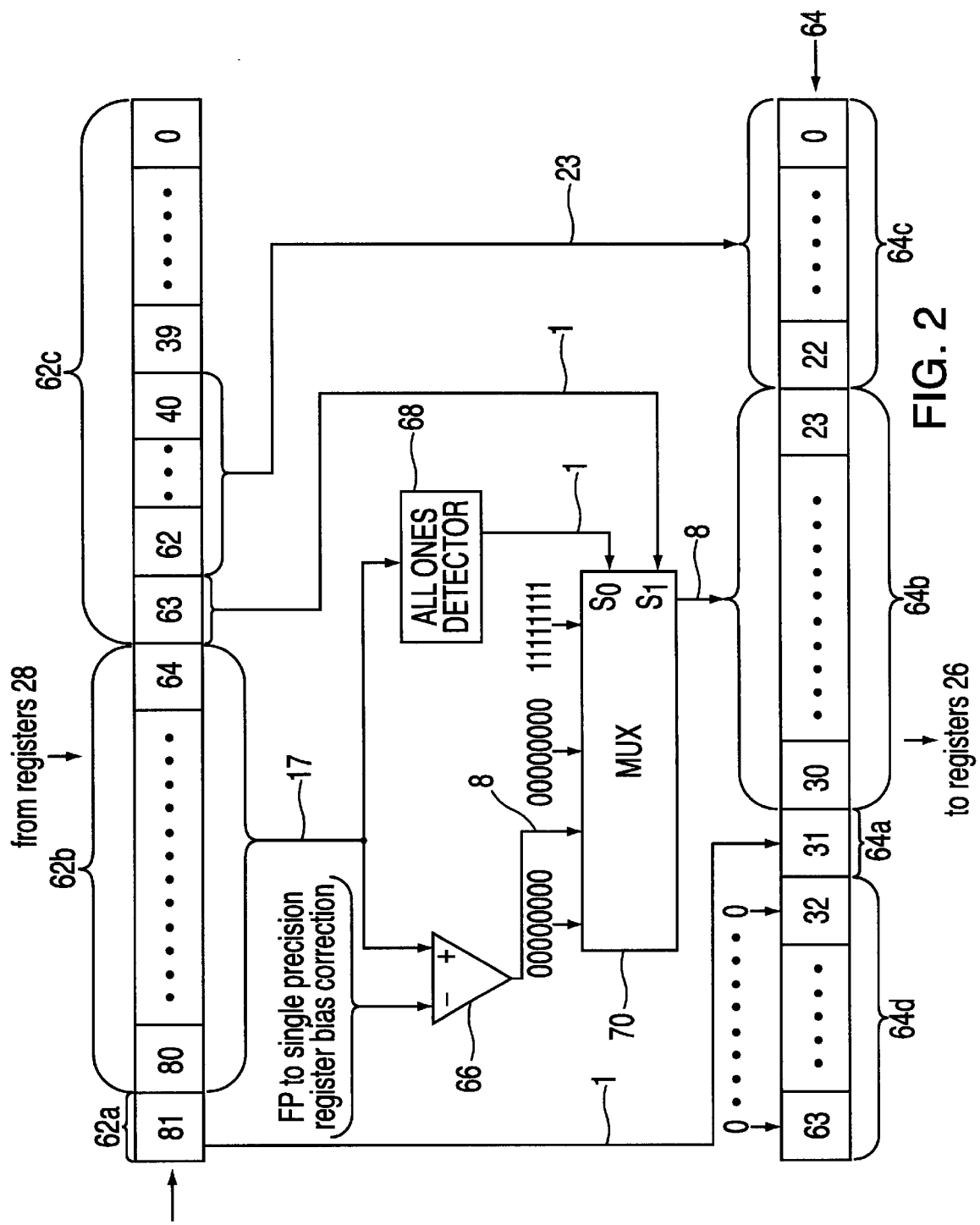
FIG. 2 illustrates data translation from floating point format data to single precision memory format data according to an exemplary embodiment of the present invention.

FIG. 2 illustrates a data format translation from data in a floating point register format to data in a single precision memory format according to an exemplary embodiment of the present invention. The data format translation from floating point register format data to single precision memory format data illustrated in FIG. 2 may be implemented, for example, in logic circuit 56 of FIG. 1. The arrangement of FIG. 2 includes a floating point register 62, an integer register 64, a subtractor 66, an all ones detector 68, and a multiplexer 70.

Floating point register 62 is an 82-bit register including a one-bit sign field 62a (bit 81), a 17-bit exponent field 62b (bits 80:64) and a 64-bit significand field 62c (bits 63:0). The most significant bit of the significand field is a one-bit "explicit one" bit (bit 63). Integer register 64 is a 64-bit memory format register. Since a single precision memory format data value is to be stored in integer register 64, integer register 64 includes a one-bit sign field 64a (bit 31), an 8-bit exponent field 64b (bits 30:23), and a 23-bit significand field 64c (bits 22:0). Additionally, the 32 most significant bits of integer register 63 stored in field 64d (bits 63:32) are set to a value of zero since the data stored in integer register 64 is stored in single precision memory format (e.g., 32-bit data).

The sign bit stored in the sign field 62a (bit 81) of floating point register 62 is directly transferred to the sign bit 64a (bit 31) of integer register 64. The 23 most significant bits after the "explicit one" bit included in the significand field 62c of floating point register 62 (i.e., bits 62:40) are directly transferred to the 23-bit significand field 64c (bits 22:0) of the integer register 64.

Subtractor 66 has two inputs and one output. The first input to subtractor 66 is connected to the 17-bit exponent value stored in the exponent field 62b (bits 80:64) of the floating point register 62. The second input of subtractor 66 is connected to a floating-point-to-single-precision-register bias correction value. The output of subtractor 66 is connected to an input of multiplexer 70. Subtractor 66 subtracts the floating-point-to-single-precision register bias correction value from the 17-bit exponent value stored in the exponent field 62b (bits 80:64) of the floating point register 62. The result of the subtraction implemented by subtractor 66 is provided to an input of multiplexer 70.

The floating-point-to-single-precision register bias correction value is a constant value determined based on a floating-point register bias value and a single-precision memory bias value. Specifically, the floating-point-to-single-precision register bias correction value in FIG. 2 is equal to the floating-point register bias value minus the single-precision-memory format bias value. These values are standard values provided in the ANSI/IEEE Standard, No. 754-1985. The standard floating-point register bias value is FFFF (hexadecimal) (65535 decimal) and the single-precision-memory format bias value is 7F (hexadecimal) (127 decimal). Therefore, the floating-point-to-single-precision register bias correction value used in FIG. 2 to translate between the floating point register format and the single precision memory format is FF80 (hexadecimal) (i.e., FFFF minus 7F). It is noted that other constant bias values may be used in implementing the present invention other than the specific values mentioned herein. Additionally, other embodiments of the present invention may be implemented which do not include a subtractor (or adder) to determine the exponent translation.

All ones detector 68 has one input and one output. The input of all ones detector 68 is connected to the 17-bit exponent field 62b of floating point register 62 (i.e., bits 80:64). All ones detector 68 detects when all 17 bits of exponent field 62b are equal to "1" and provides a one bit output signal responsive to the detection. In the embodiment illustrated in FIG. 2, a "1" output signal provided by all ones detector 68 indicates that the value of the exponent field 62b of floating point register 62 is "11111111111111111" and a "0" output signal provided by all ones detector 68 indicates that the value of the exponent field 62b of floating point register 62 is not "11111111111111111". All ones detector 68 may be implemented, for example, using a comparator which compares the value of the 17-bit exponent field 62b (bits 80:64) with a value of "11111111111111111".

Multiplexer 70 has four inputs, two select lines and one output. The first select line (S0) of multiplexer 70 is connected to the output of all ones detector 68. The second select line (S1) of multiplexer 70 is connected to the "explicit one" bit (bit 63) of floating point register 62. The first input of multiplexer 70 is an eight bit input tied to a value of "00000000". The second input of multiplexer 70 is an eight bit input connected to the output of subtractor 66. The third input of multiplexer 70 is an eight bit input tied to a value of "00000000". The fourth input of multiplexer 70 is an eight bit input tied to a value of "11111111". The output of multiplexer 70 is provided to the eight bit exponent field 64b (bits 30:23) of integer register 64.

Multiplexer 70 provides an eight bit output signal in response to the two select lines and four input lines as follows. If a value of "0" is provided on select line S0 and a value of "0" is provided on select line S1, multiplexer 70 provides an output value of "00000000" to exponent field 64b. If select line S0 receives a value of "0" and select line S1 receives a value of "1", multiplexer 70 provides the value of the output of subtractor 66 to exponent field 64b. If select line S0 receives a value of "1" and select line S1 receives a value of "0", multiplexer 70 provides an output value of "00000000" to exponent field 64b. If select line S0 receives a value of "1" and select line S1 receives a value of "1", multiplexer 70 provides an output value of "11111111" to exponent field 64b.

In this manner, if the "explicit one" bit (bit 63) of floating point register 62 is "0", then a value of "00000000" is stored in exponent field 64b of integer register 64 (bits 30:23). If the "explicit one" bit is "1" and the value of exponent field 62b of floating point register 62 (bits 80:64) is "11111111111111111", then a value of "11111111" is stored in exponent field 64b. If the "explicit one" bit is "1" and the value of exponent field 62b of floating point register 62 (bits 80:64) is not "11111111111111111", then a value calculated by subtractor 66 is stored in exponent field 64b.

The 40 least significant bits of the significand field 62c of floating point register 62 (i.e., bits 39:0) are not used in the translation from the floating point register format data in the floating point register to the single precision memory format data in the integer register.

Figure 3:
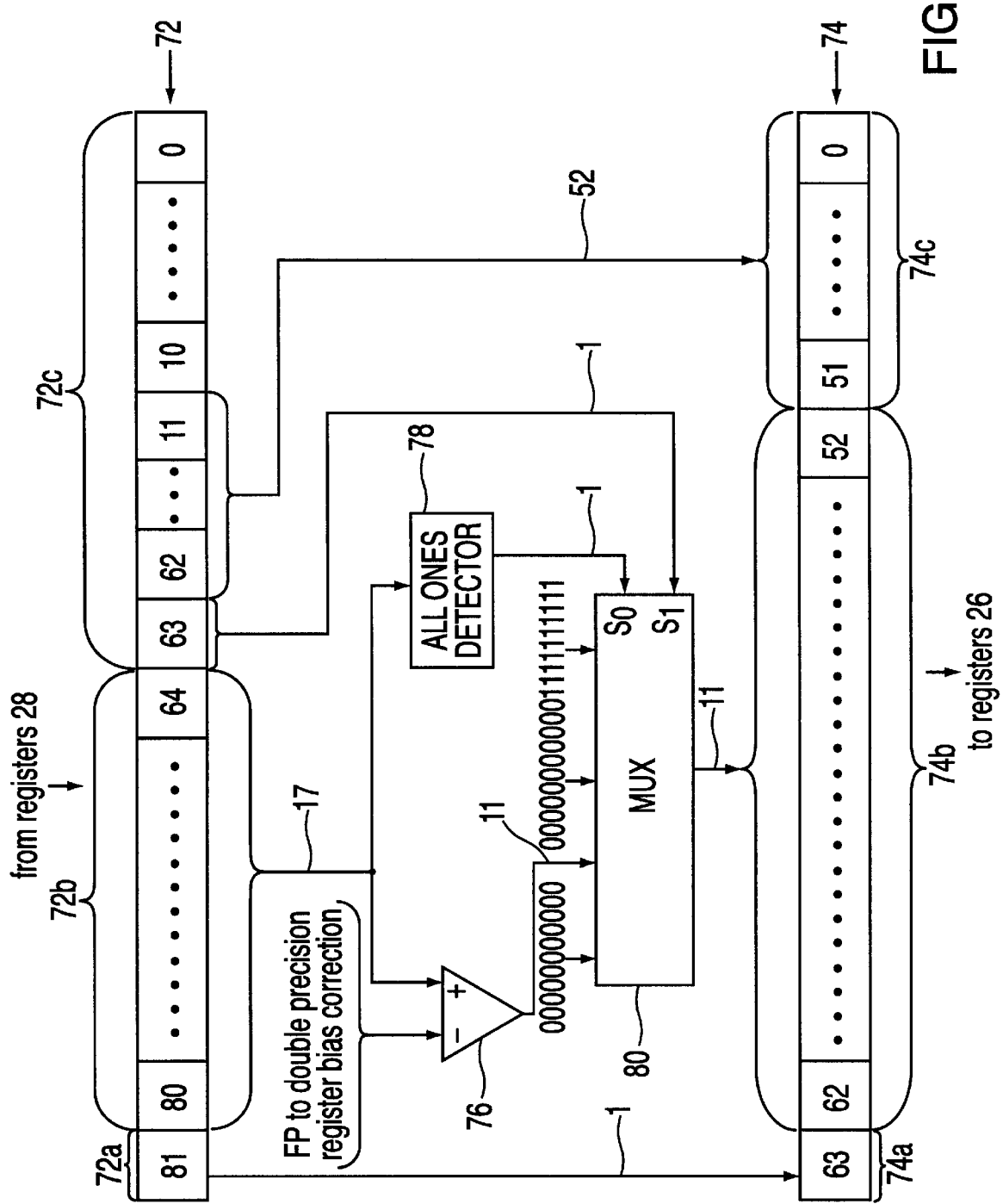
FIG. 3 illustrates data translation from floating point format data to double precision memory format data according to an exemplary embodiment of the present invention.

FIG. 3 illustrates data format translation from floating point format data to double precision memory format data according to an exemplary embodiment of the present invention. The data format translation from floating point format data to double precision memory format data illustrated in FIG. 3 may be implemented, for example, in logic circuit 56 of FIG. 1. The arrangement of FIG. 3 includes a floating point register 72, an integer register 74, a subtractor 76, an all ones detector 78 and a multiplexer 80.

Floating point register 72 includes a one-bit sign field 72a (bit 81), a 17-bit exponent field 72b (bits 80:64), and a 64-bit significand field 72c (bits 63:0) similar to the fields 62a, 62b and 62c of floating point register 62 of FIG. 2. Integer register 74 is used in FIG. 3 to illustrate an integer register storing data in a double precision memory format (e.g., a 64-bit format). Therefore, integer register 74 includes a one-bit sign field 74a (bit 63), an 11-bit exponent field 74b (bits 62:52), and a 52-bit significand field 74c (bits 51:0). The one-bit sign value stored in sign field 72a of floating point register 72 (bit 81) is directly transferred to the one-bit sign field 74a of integer register 74 (bit 63). Similarly, the 52 most significant bits of the significand field 72c of floating point register 72 after the "explicit one" bit (i.e., bits 62:11) are directly transferred to the significand field 74c (bits 51:0) of integer register 74.

Subtractor 76 has two inputs and one output. The first input of subtractor 76 is connected to the exponent field 72b (bits 80:64) of floating point register 72. The second input of subtractor 76 is connected to a floating-point-to-double-precision register bias correction value. The output of subtractor 76 is an eleven bit output connected to an input of multiplexer 80.

Subtractor 76 subtracts the floating-point-to-double-precision register bias correction value from the 17-bit exponent value stored in the exponent field 72b (bits 80:64) of floating point register 72. The output of subtractor 76 is an 11-bit result which is transferred to an input of multiplexer 80. The floating-point-to-double-precision register bias correction value is a constant value based on the floating-point register bias value minus a double-precision memory bias value. The double-precision memory bias value is a constant value similar to the single-precision memory format bias value discussed in referenece to FIG. 2. As mentioned above, the floating point register bias value is FFFF (hexadecimal). The double-precision memory bias value is 3FF (hexadecimal). Therefore, the floating-point-to-double-precision register bias correction value is FC00 (hexadecimal) (i.e., FFFF minus 3FF). Other constant values could also be used in implementing the present invention. Additionally, other embodiments of the present invention may be implemented which do not include a subtractor (or adder) to determine the exponent translation.

All ones detector 78 has one input and one output. The input of all ones detector 78 is connected to the 17-bit exponent field 72b of floating point register 72 (i.e., bits 80:64). All ones detector 78 detects when all 17 bits of exponent field 72b are equal to "1" and provides a one bit output signal responsive to the detection. In the embodiment illustrated in FIG. 3, a "1" output signal provided by all ones detector 78 indicates that the value of the exponent field 72b of floating point register 72 is "11111111111111111" and a "0" output signal provided by all ones detector 78 indicates that the value of the exponent field 72b of floating point register 72 is not "11111111111111111". All ones detector 78 may be implemented, for example, using a comparator which compares the value of the 17-bit exponent field 72b (bits 80:64) with a value of "11111111111111111".

Multiplexer 80 has four inputs, two select lines and one output. The first select line (S0) of multiplexer 80 is connected to the output of all ones detector 78. The second select line (S1) of multiplexer 80 is connected to the "explicit one" bit (bit 63) of floating point register 72. The first input of multiplexer 80 is an eleven bit input tied to a value of "00000000000". The second input of multiplexer 80 is an eleven bit input connected to the output of subtractor 76. The third input of multiplexer 80 is an eleven bit input tied to a value of "00000000000". The fourth input of multiplexer 80 is an eleven bit input tied to a value of "11111111111". The output of multiplexer 80 is provided to the eleven bit exponent field 74b (bits 62:52) of integer register 74.

Multiplexer 80 provides an eleven bit output signal in response to the two select lines and four input lines as follows. If a value of "0" is provided on select line S0 and a value of "0" is provided on select line S1, multiplexer 80 provides an output value of "00000000000" to exponent field 74b. If select line S0 receives a value of "0" and select line S1 receives a value of "1", multiplexer 80 provides the value of the output of subtractor 76 to exponent field 74b. If select line S0 receives a value of "1" and select line S1 receives a value of "0", multiplexer 80 provides an output value of "00000000000" to exponent field 74b. If select line S0 receives a value of "1" and select line S1 receives a value of "1", multiplexer 80 provides an output value of "11111111111" to exponent field 74b.

In this manner, if the "explicit one" bit (bit 63) of floating point register 72 is "0", then a value of "00000000000" is stored in exponent field 74b of integer register 74 (bits 62:52). If the "explicit one" bit is "1" and the value of exponent field 72b of floating point register 72 (bits 80:64) is "11111111111111111", then a value of "11111111111" is stored in exponent field 74b. If the "explicit one" bit is "1" and the value of exponent field 72b of floating point register 72 (bits 80:64) is not "11111111111111111", then the value calculated by subtractor 76 is stored in exponent field 74b.

The eleven least significant bits of the significand field 72c of floating point register 72 (i.e., bits 10:0) are not used in the translation from the floating point format data in the floating point register to the double precision memory format data in the integer register.

Figure 4:
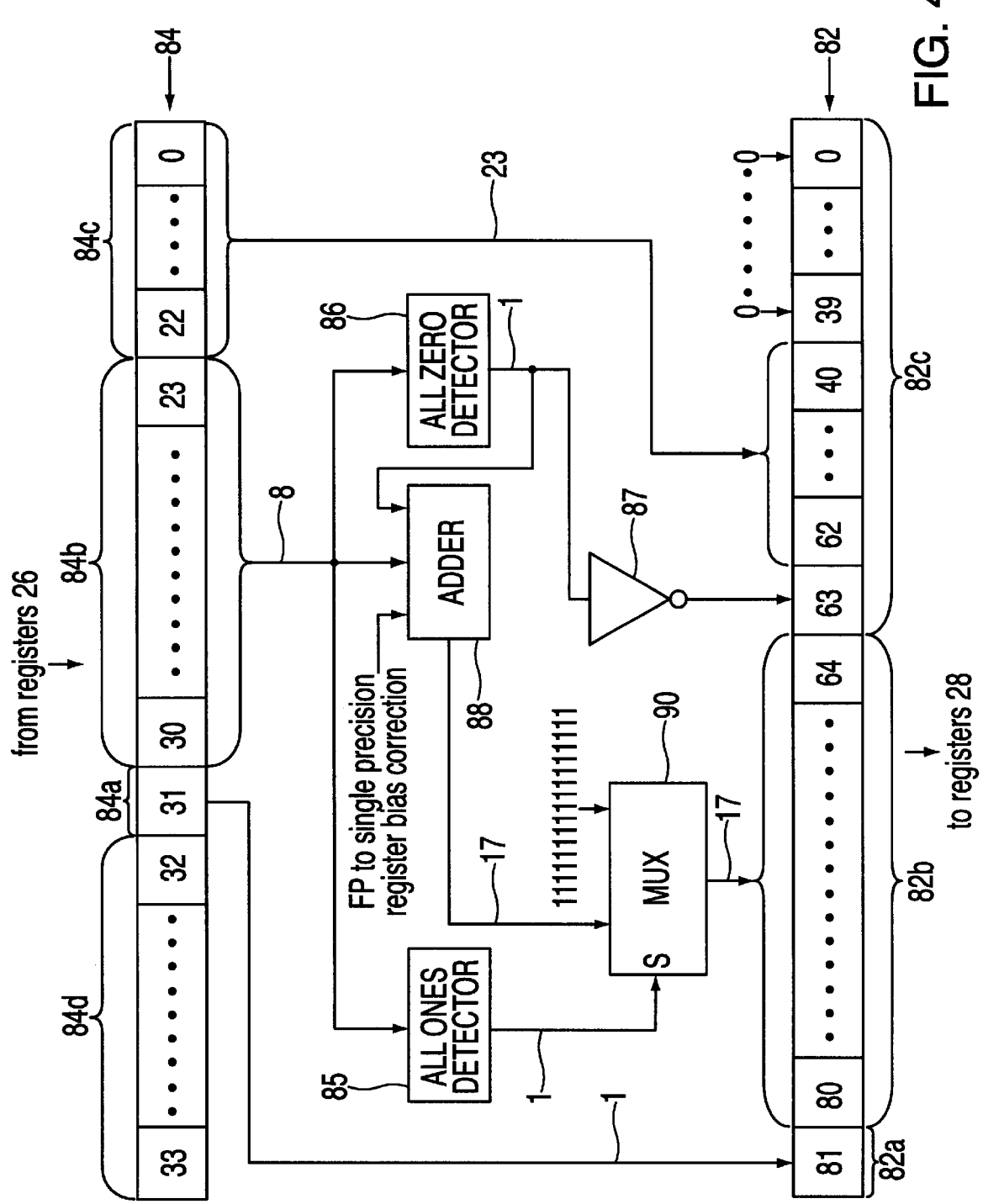
FIG. 4 illustrates data translation from single precision memory format data to floating point format data according to an exemplary embodiment of the present invention.

FIG. 4 illustrates data format translation from single precision memory format data to floating point format data according to an exemplary embodiment of the present invention. The data format translation from single precision format data to floating point format data illustrated in FIG. 4 may be implemented, for example, in logic circuit 56 of FIG. 1. The arrangement of FIG. 4 includes a floating point register 82, an integer register 84, an all ones detector 85, and all zero detector 86, an inverter 87, an adder 88 and a multiplexer 90.

Floating point register 82 is a floating point register similar to floating point registers 62 and 72 of FIGS. 2 and 3 and includes a one-bit sign field 82a (bit 81), a 17-bit exponent field 82b (bits 80:64) and a 64-bit significand field 82c (bits 63:0). Integer register 84 is similar to integer register 64 of FIG. 2 and includes a one-bit sign field 84a (bit 31), an 8-bit exponent field 84b (bits 30:23), and a 23-bit significand field 84c (bits 22:0). Additionally, the 32 most significand bits 84d of the integer register 84 (i.e., bits 63:32) have a value of zero, since the data stored in that integer register is stored in a 32-bit single precision memory format. However, it is noted that, in an alternative exemplary embodiment, the field 84d of integer register 84 (and the field 64d of integer register 64 of FIG. 2) could hold a single precision memory format data value different than the single precision memory format data value stored in the 32 least significant bits of integer register 84. Field 84d could be split into a one bit sign field (bit 63), an eight bit exponent field (bits 62:55) and a 23-bit significand field (bits 54:32). In such an embodiment, the single precision memory format to floating point format data translation illustrated in FIG. 4 could additionally be implemented on the single precision memory format data stored in field 84d in a manner similar to the exemplary embodiment of FIG. 4.

The one-bit sign value stored in sign field 84a (bit 31) of integer register 84 is directly transferred to the one-bit sign field 82a (bit 81) of floating point register 82. Similarly, the significand value stored in the significand field 84c (bits 22:0) of integer register 84 is directly transferred to the 23 most significant bits of the significand field 82c of integer register 82 after the "explicit one" most significant bit of the significand field 82c (i.e., to bits 62:40). The 40 least significant bits of the significand field 82c (bits 39:0) of floating point register 82 are each provided with a zero bit.

All ones detector 85 has one input and one output. The input of all ones detector 85 is connected to the eight bit exponent field 84b of integer register 84 (i.e., bits 30:23). All ones detector 85 detects when all eight bits of exponent field 84b are equal to "1" and provides a one bit output signal responsive to the detection. In the embodiment illustrated in FIG. 4, a "1" output signal provided by all ones detector 85 indicates that the value of exponent field 84b is "11111111" and a "0" output signal indicates that the value of exponent field 84b is not "11111111". All ones detector 85 may be implemented, for example, using a comparator which compares the value of the eight bit exponent field 84b with a value of "11111111".

All zero detector 86 has one input and one output. The input of all zero detector 86 is connected to the eight bit exponent field 84b of integer register 84 (i.e., bits 30:23). All zero detector 86 detects when all eight bits of exponent field 84b are equal to "0" and provides a one bit output signal responsive to the detection. In the embodiment illustrated in FIG. 4, a "1" output signal provided by all zero detector 86 indicates that the value of exponent field 84b is "00000000" and a "0" output signal indicates that the value of exponent field 84b is not "00000000". All zero detector 86 may be implemented, for example, using a comparator which compares the value of the eight bit exponent field 84b with a value of "00000000".

Inverter 87 has an input connected to the output of all zero detector 86 and an output connected to the "explicit one" bit of floating point register 82 (bit 63). The "explicit one" bit (bit 63) of floating point register 82 is provided with a "0" when the value of the exponent field 84b of integer register 84 is equal to "00000000" and with a "1" when the value of the exponent field 84b is not equal to "00000000".

Adder 88 includes three inputs and one output. The first input of adder 88 is connected to the floating-point-to-single-precision register bias correction value. The second input of adder 88 is connected to the 8-bit exponent field 84b (bits 30:23) of integer register 84. The third input of adder 88 is connected to the output of all zero detector 86. The output of adder 88 is connected to an input of multiplexer 90. Adder 88 adds the floating-point-to-single-precision register bias correction value to the 8-bit exponent value 84b (bits 30:23) of integer register 84. Additionally, the adder adds a "1" value output from all zero detector 86 when the value of the exponent field 84b is "00000000". The floating-point-to-single-precision register bias correction value is the same as the value used in the exemplary embodiment of FIG. 2. A 17-bit result of the adding operation performed by the adder 88 is provided to an input of multiplexer 90.

Multiplexer 90 has two inputs, one select line and one output. The first input of multiplexer 90 is connected to the 17 bit output of adder 88. The second input of multiplexer 90 is a 17 bit input tied to a value of "11111111111111111". The select line of multiplexer 90 is connected to the output of all ones detector 85. The output of multiplexer 90 is a 17 bit output connected to the 17 bit exponent field 82b of floating point register 82. If the value of exponent field 84b is detected by all ones detector 85 is "11111111", multiplexer 90 provides the value of "11111111111111111" to exponent field 82b of floating point register 82. If the value of exponent field 84b is detected by all ones detector 85 as not being "11111111", multiplexer 90 provides the 17 bit value output by adder 88 to exponent field 82b of floating point register 82.

Figure 5:
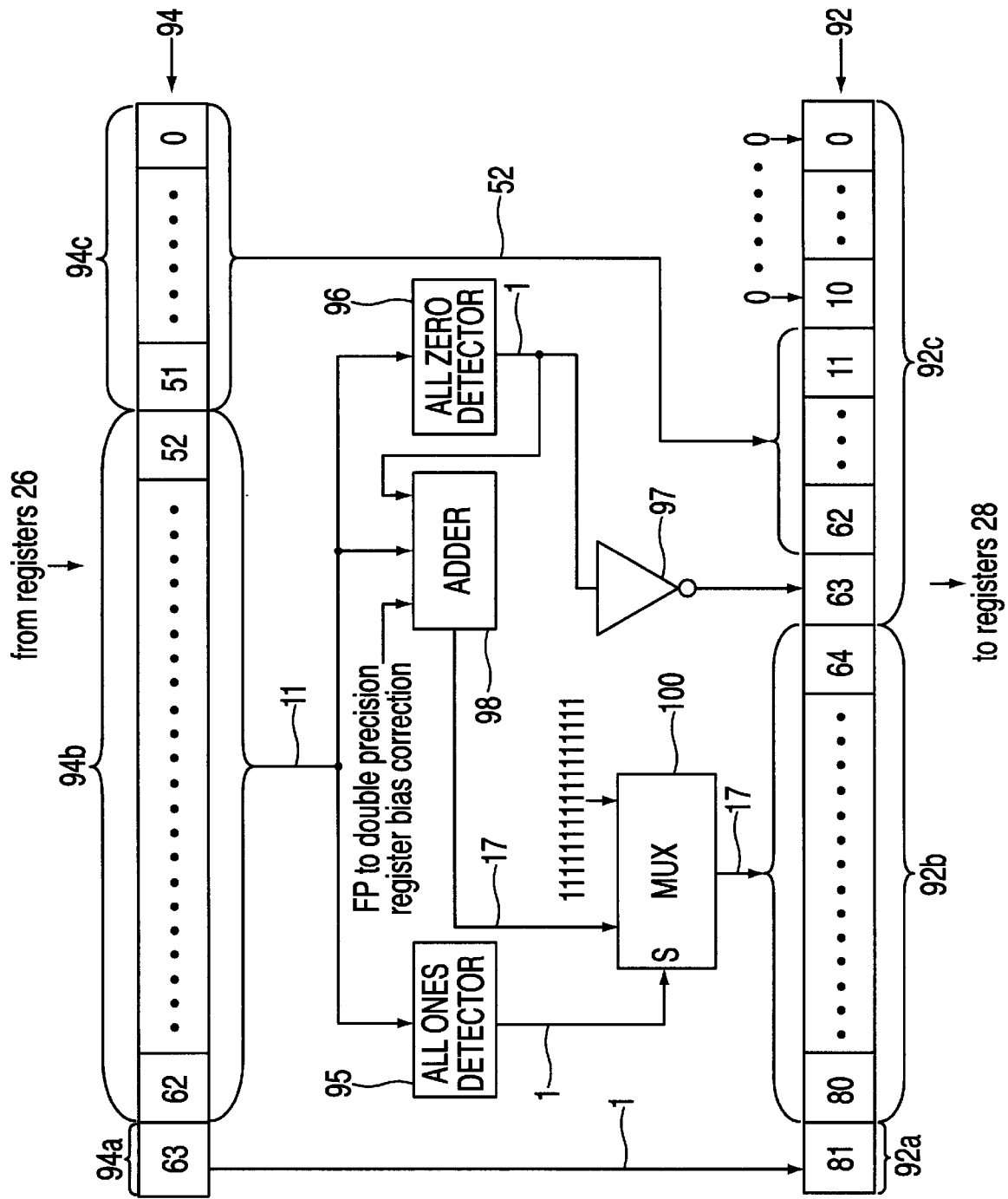
FIG. 5 illustrates data translation from double precision memory format data to floating point format data according to an exemplary embodiment of the present invention.

FIG. 5 illustrates data format translation from double precision memory format data to floating point format data according to an exemplary embodiment of the present invention. The data format translation from double precision memory format to floating point format illustrated in FIG. 5 may be implemented, for example, in logic circuit 56 of FIG. 1. The arrangement of FIG. 5 inclues a floating point register 92, an integer register 94, an all ones detector 95, an all zero detector 96, an inverter 97, an adder 98 and a multiplexer 100.

Floating point register 92 includes a one-bit sign field 92a (bit 81), a 17-bit exponent field 92b (bits 80:64) and a 64-bit significand field 92c (bits 63:0). Integer register 94 includes a one-bit sign field 94a (bit 63), an 11-bit exponent field 94b (bits 62:52) and a 52-bit significand field 94c (bits 51:0). The sign value stored in the sign field 94a (bit 63) of integer register 94 is directly transferred to the sign field 92a (bit 81) of floating point register 92. Similarly, the 52-bit significand value stored in the significand field 94c (bits 51:0) of integer register 94 is directly transferred to the significand field 92c (bits 62:11) of floating point register 92. Specifically, this 52-bit value is transferred to the 52-most significant bits after the "explicit one" most significant bit 63 of the significand field 92c of floating point register 92 (i.e., bits 62:11). Eleven "zero" bits are stored in the 11 least significant bits of the significand field 92c of floating point register 92 (i.e., bits 10:0).

All ones detector 95 has one input and one output. The input of all ones detector 95 is connected to the eleven bit exponent field 94b of integer register 94 (i.e., bits 62:52). All ones detector 95 detects when all eleven bits of exponent field 94b are equal to "1" and provides a one bit output signal responsive to the detection. In the embodiment illustrated in FIG. 5, a "1" output signal provided by all ones detector 95 indicates that the value of exponent field 94b is "11111111111" and a "0" output signal indicates that the value of exponent field 94b is not "11111111111". All ones detector 95 may be implemented, for example, using a comparator which compares the value of the eleven bit exponent field 94b with a value of "11111111111".

All zero detector 96 has one input and one output. The input of all zero detector 96 is connected to the eleven bit exponent field 94b of integer register 94 (i.e., bits 62:52). All zero detector 96 detects when all eleven bits of exponent field 94b are equal to "0" and provides a one bit output signal responsive to the detection. In the embodiment illustrated in FIG. 5, a "1" output signal provided by all zero detector 96 indicates that the value of exponent field 94b is "00000000000" and a "0" output signal indicates that the value of exponent field 94b is not "00000000000". All zero detector 96 may be implemented, for example, using a comparator which compares the value of the eleven bit exponent field 94b with a value of "00000000000".

Inverter 97 has an input connected to the output of all zero detector 96 and an output connected to the "explicit one" bit of floating point register 92 (bit 63). The "explicit one" bit (bit 63) of floating point register 92 is provided with a "0" when the value of the exponent field 94b of integer register 94 is equal to "00000000000" and with a "1" when the value of the exponent field 94b is not equal to "00000000000".

Adder 98 has three inputs and one output. The first input of adder 98 is connected to the floating-point-to-double-precision register bias value. The second input of adder 98 is connected to the 11-bit exponent value stored in exponent field 94b (bits 62:52) of integer register 94. The third input of adder 98 is connected to an output of all zero detector 96. The output of adder 98 is connected to an input of multiplexer 100. Adder 98 adds the floating-point-to-double-precision register bias correction value to the 11-bit exponent value stored in exponent field 94b (bits 62:52) of integer register 94 to obtain a 17-bit sum. Additionally, if all zero detector 96 detects a value of exponent field 94b of "00000000000", adder 98 adds a value of one to the floating-point-to-double-precision register bias correction value. The 17-bit sum output of adder 98 is provided to an input of multiplexer 100.

Multiplexer 100 has two inputs, one select line and one output. The first input of multiplexer 100 is connected to the 17 bit output of adder 98. The second input of multiplexer 100 is a 17 bit input tied to a value of "11111111111111111". The select line of multiplexer 100 is connected to the output of all ones detector 95. The output of multiplexer 100 is a 17 bit output connected to the 17 bit exponent field 92b of floating point register 92. If the value of exponent field 94b is detected by all ones detector 95 is "11111111111", multiplexer 100 provides the value of "11111111111111111" to exponent field 92*b* of floating point register 92. If the value of exponent field 94*b* is detected by all ones detector 95 as not being "1111111111", multiplexer 100 provides the 17 bit value output by adder 98 to exponent field 92*b* of floating point register 92.

Figure 6:
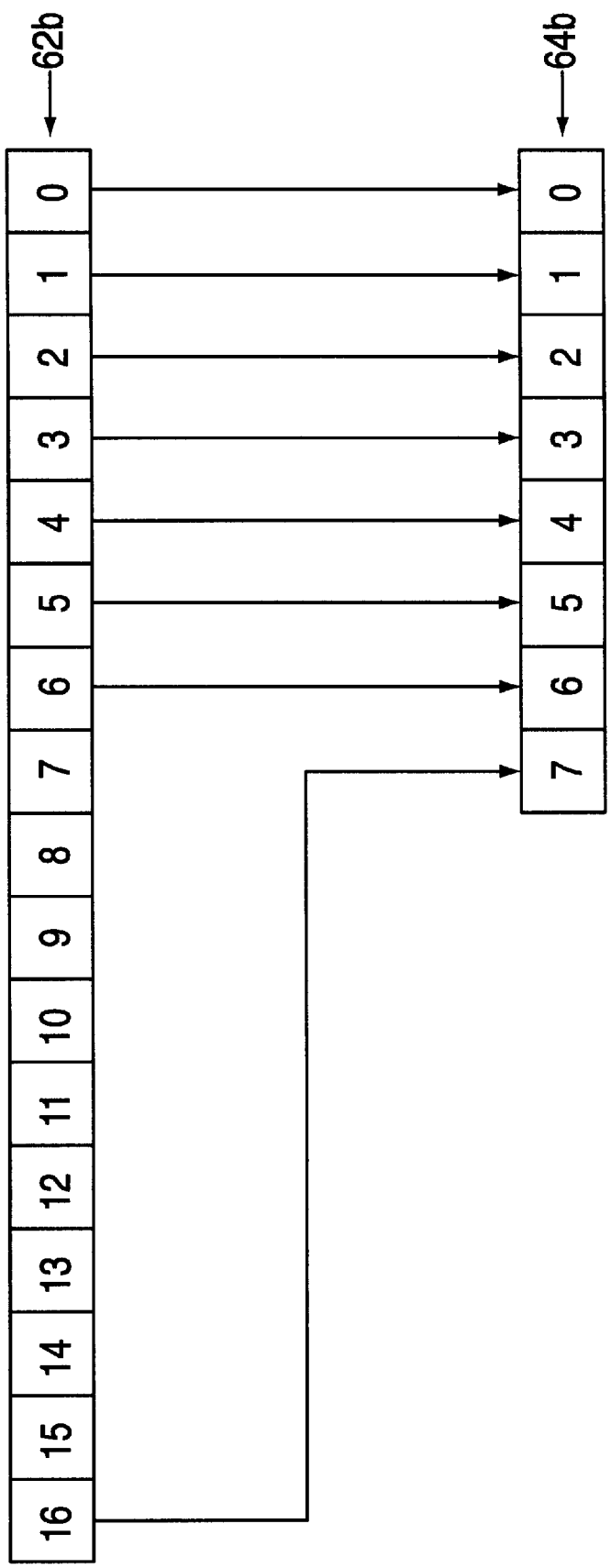
FIG. 6 illustrates data translation from floating point format data to single precision memory format data according to an exemplary embodiment of the present invention.

FIG. 6 illustrates data translation from floating point format data to single precision memory format data according to an exemplary embodiment of the present invention. Specifically, FIG. 6 illustrates translation of an exponent field of floating point format data to an exponent field of single precision memory format data which may be used in place of the subtractor 66 of the embodiment illustrated in FIG. 2. The seven least significant bits from the exponent field 62*b* of floating point register 62 (e.g., bits 70:64 in FIG. 2) are directly transferred to the seven least significant bits of the exponent field 64*b* of integer register 64 (e.g., bits 29:23 in FIG. 2). The most significant bit from the exponent field 62*b* of floating point register 62 (e.g., bit 80 in FIG. 2) is directly transferred to the most significant bit of the exponent field 64*b* of integer register 64 (e.g, bit 30 in FIG. 2). The exemplary embodiment of FIG. 6 provides a similar result to subtractor 66 in FIG. 2 without the inherent propagation delays resulting from using subtractor 66.

Figure 7:
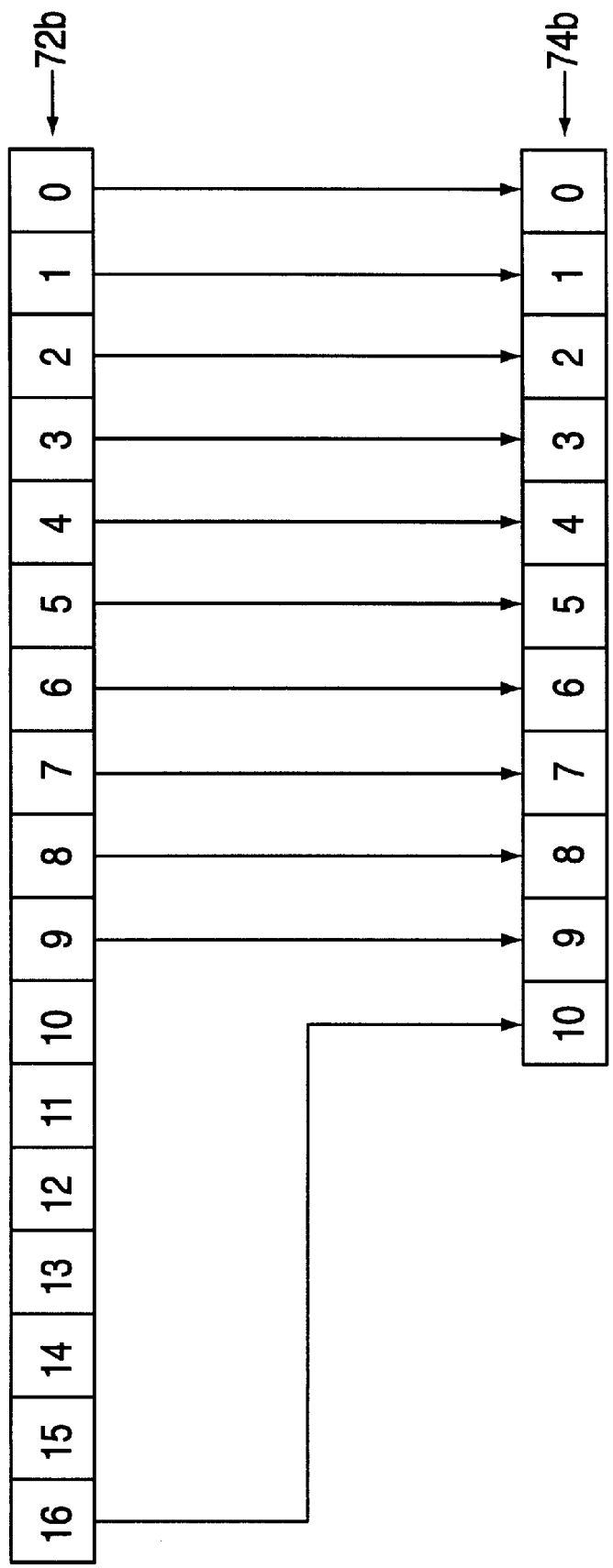
FIG. 7 illustrates data translation from floating point format data to double precision memory format data according to an exemplary embodiment of the present invention.

FIG. 7 illustrates data translation from floating point format data to double precision memory format data according to an exemplary embodiment of the present invention. Specifically, FIG. 7 illustrates translation of an exponent field of floating point format data to an exponent field of double precision memory format data which may be used in place of the subtractor 76 of the embodiment illustrated in FIG. 3. The ten least significant bits from the exponent field 72*b* of floating point register 72 (e.g., bits 73:64 in FIG. 3) are directly transferred to the ten least significant bits of the exponent field 74*b* of integer register 74 (e.g., bits 61:52 in FIG. 3). The most significant bit from the exponent field 72*b* of floating point register 72 (e.g., bit 80 in FIG. 3) is directly transferred to the most significant bit of the exponent field 74*b* of integer register 64 (e.g, bit 62 in FIG. 3). The exemplary embodiment of FIG. 7 provides a similar result to subtractor 76 in FIG. 3 without the inherent propagation delays resulting from using subtractor 76.

Figure 8:
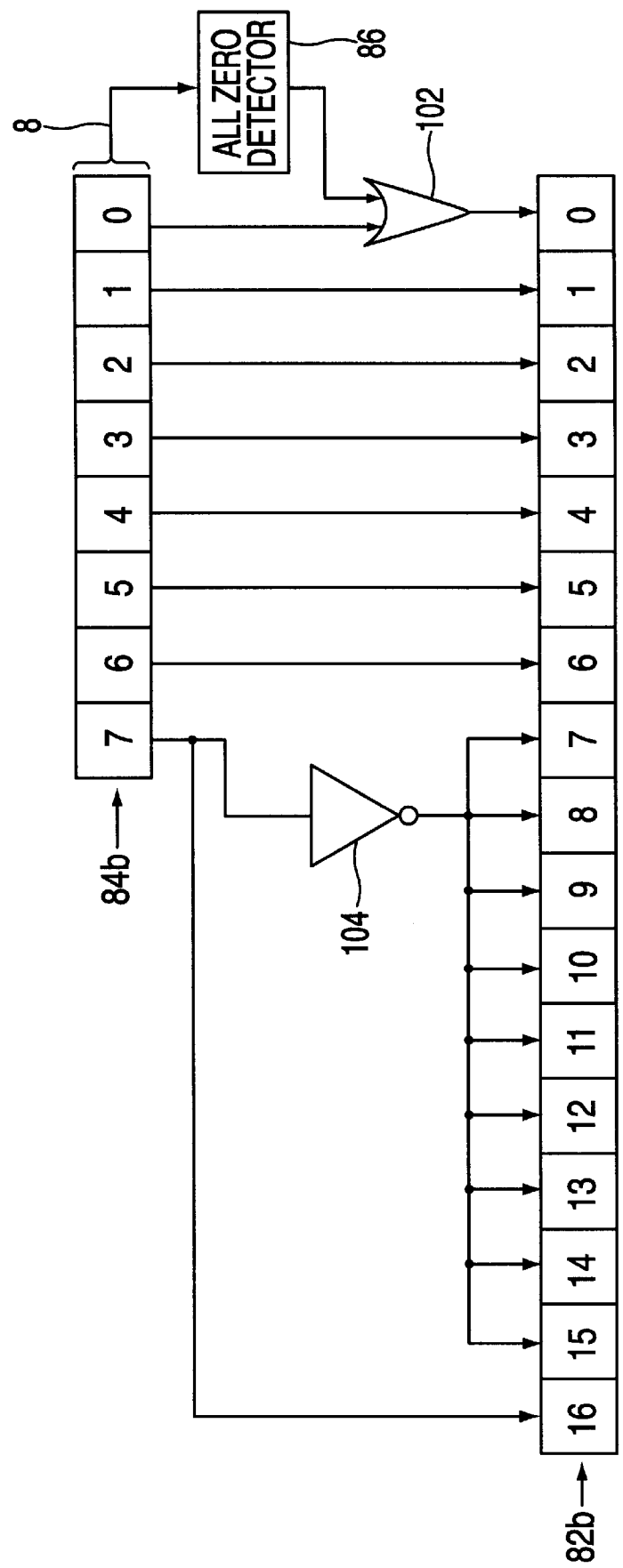
FIG. 8 illustrates data translation from single precision memory format data to floating point format data according to an exemplary embodiment of the present invention.

FIG. 8 illustrates data translation from single precision memory format data to floating point format data according to an exemplary embodiment of the present invention. Specifically, FIG. 8 illustrates translation of an exponent field of single precision memory format data to an exponent field of floating point format data which may be used in place of the adder 88 of the embodiment illustrated in FIG. 4. An OR gate 102 illustrated in FIG. 8 has two inputs and one output. The first input of OR gate 102 is connected to the output of all zero detector 86 (see FIG. 4). A second input of OR gate 102 is connected to the least significant bit of exponent field 84*b* of integer register 84 of FIG. 4 (e.g., bit 23). Therefore, if the exponent field 84*b* of integer register 84 is "00000000", OR gate 102 provides a value of "1" to the least significant bit of exponent field 82*b* of floating point register 82 (e.g., bit 64 in FIG. 4). If the exponent field 84*b* of integer register 84 is not "00000000", OR gate 102 provides the value of the least significant bit of exponent field 84*b* of integer register 84 (e.g., bit 23 in FIG. 4) to the least significant bit of exponent field 82*b* of floating point register 82 (e.g., bit 64). The next six least significant bits after the least significant bit from the exponent field 84*b* of integer register 84 (e.g., bits 29:24 in FIG. 4) are directly transferred to the next six least significant bits of the exponent field 82*b* of floating point register 82 (e.g., bits 70:65 in FIG. 4). The most significant bit from the exponent field 84*b* of integer register 84 (e.g., bit 30 in FIG. 4) is directly transferred to the most significant bit of the exponent field 82*b* of floating point register 82 (e.g, bit 80 in FIG. 4). Inverter 104 has an input connected to the most significant bit from the exponent field 84*b* of integer register 84 (e.g., bit 30) and an output. Inverter 104 provides the complement of the most significant bit from the exponent field 84*b* of integer register 84 (e.g., bit 30) to the nine most significant bits of the exponent field 82*b* of floating point register 82 (e.g., bits 79:71 of FIG. 4). The exemplary embodiment of FIG. 8 provides a similar result to adder 88 in the exemplary embodiment of FIG. 4 without the inherent propagation delays resulting from using adder 88.

Figure 9:
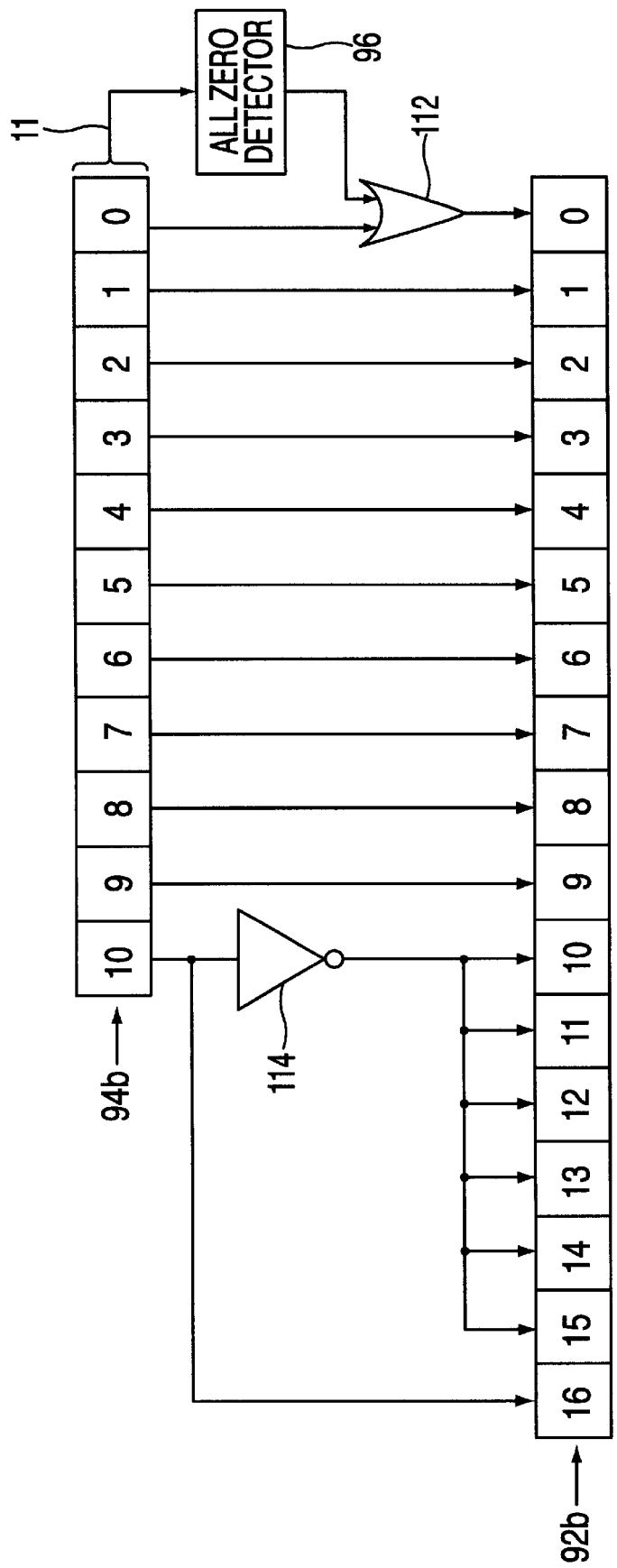
FIG. 9 illustrates data translation from double precision memory format data to floating point format data according to an exemplary embodiment of the present invention.

FIG. 9 illustrates data translation from double precision memory format data to floating point format data according to an exemplary embodiment of the present invention. Specifically, FIG. 9 illustrates translation of an exponent field of double precision memory format data to an exponent field of floating point format data which may be used in place of the adder 98 of the embodiment illustrated in FIG. 5. An OR gate 112 illustrated in FIG. 9 has two inputs and one output. The first input of OR gate 112 is connected to the output of all zero detector 96 (see FIG. 5). A second input of OR gate 112 is connected to the least significant bit of exponent field 94*b* of integer register 94 of FIG. 4 (e.g., bit 52). Therefore, if the exponent field 94*b* of integer register 94 is "00000000000", OR gate 112 provides a value of "1" to the least significant bit of exponent field 92*b* of floating point register 92 (e.g., bit 64 in FIG. 5). If the exponent field 94*b* of integer register 94 is not "00000000000", OR gate 112 provides the value of the least significant bit of exponent field 94*b* of integer register 94 (e.g., bit 52 in FIG. 5) to the least significant bit of exponent field 92*b* of floating point register 92 (e.g., bit 64). The next nine least significant bits after the least significant bit from the exponent field 94*b* of integer register 94 (e.g., bits 61:53 in FIG. 5) are directly transferred to the next nine least significant bits of the exponent field 92*b* of floating point register 92 (e.g., bits 73:65 in FIG. 5). The most significant bit from the exponent field 94*b* of integer register 94 (e.g., bit 62 in FIG. 5) is directly transferred to the most significant bit of the exponent field 92*b* of floating point register 92 (e.g, bit 80 in FIG. 5). Inverter 114 has an input connected to the most significant bit from the exponent field 94*b* of integer register 94 (e.g., bit 62) and an output. Inverter 114 provides the complement of the most significant bit from the exponent field 94*b* of integer register 94 (e.g., bit 62) to the six most significant bits of the exponent field 92*b* of floating point register 92 after the most significant bit (e.g., bits 79:74 of FIG. 5). The exemplary embodiment of FIG. 9 provides a similar result to adder 98 in the exemplary embodiment of FIG. 5 without the inherent propagation delays resulting from using adder 98.

Figure 10:
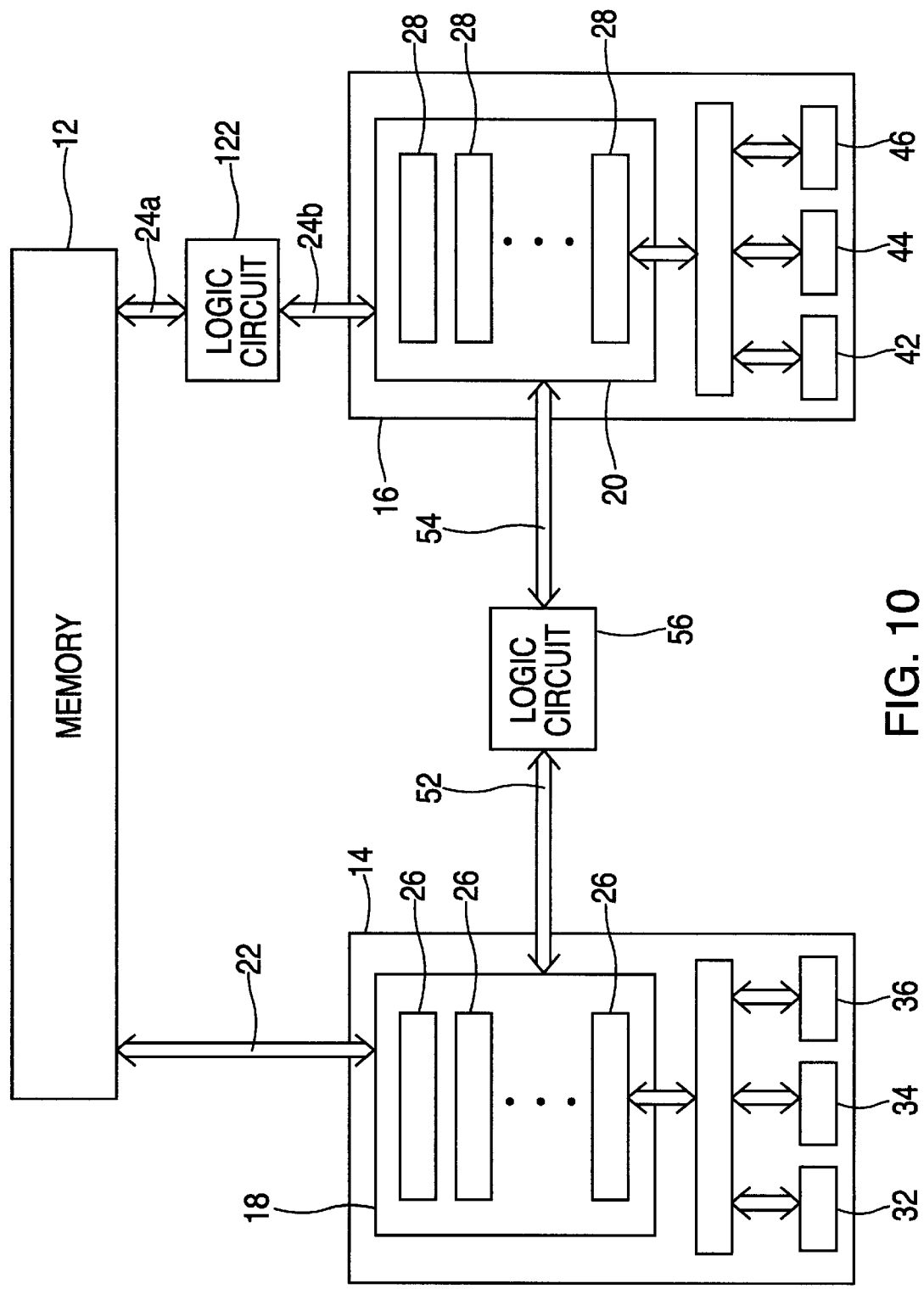
FIG. 10 illustrates an arrangement for direct data transfer and translation between an integer processing unit and a floating point processing unit according to a further exemplary embodiment of the present invention.

FIG. 10 illustrates a data transfer and translation arrangement according to another exemplary embodiment of the present invention. Elements of FIG. 10 corresponding to the same elements illustrated in FIG. 1 are identified by the same reference numerals. Therefore, a description of these elements is omitted in the description of FIG. 10. In FIG. 6, an additional logic circuit 122 is included in a coupling arrangement between memory 12 and floating point processing unit 16. A bi-directional bus 24*a* provides data transfer between memory 12 and the logic circuit 122. A bi-directional bus 24*b* provides data transfer between the logic circuit 122 and the floating point register files 20. Since data is normally stored in memory 12 in a memory format, the bus 24a provides memory format data values between memory 12 and logic circuit 122 (e.g., 64-bit data). The memory formats could include the single precision memory format and the double precision memory format, for example. Additionally, logic circuit 122 may provide additional functions beyond data translation between the single precision memory format, double precision memory format, and floating point format. For example, 80 bit double extended format data or integer format data may also be translated to floating point format data using logic circuit 122.

Bi-directional bus 24b provides data transfer of floating point data between logic circuit 122 and the floating point register files 20 (e.g., 82-bit data). Logic circuit 122 is similar to logic circuit 56. Specifically, logic circuit 122 provides at least the functions of floating point format to single precision memory format translation, floating point format to double precision memory format translation, single precision memory format to floating point format translation and double precision memory format to floating point format translation. Examples of these translations is illustrated in FIGS. 2–9.

Figure 11:
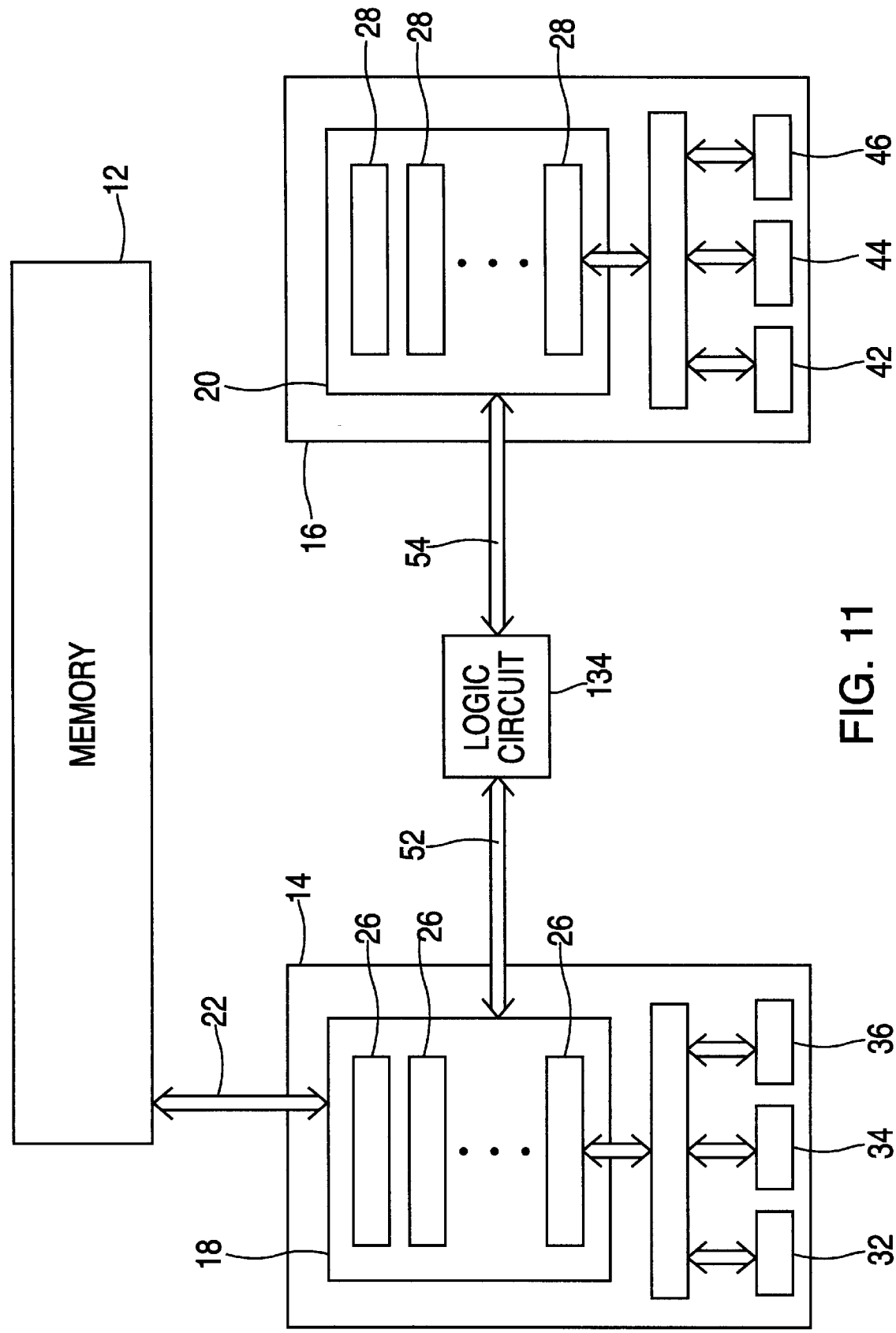
FIG. 11 illustrates an arrangement for direct data transfer and translation between an integer processing unit and a floating point processing unit according to yet another exemplary embodiment of the present invention.

FIG. 11 illustrates a data transfer and translation arrangement according to a further exemplary embodiment of the present invention. Elements of FIG. 11 corresponding to the same elements illustrated in FIG. 1 are identified by the same reference numerals. In addition to the elements included in FIG. 1, FIG. 11 includes a bi-directional bus 132 and a logic circuit 134. Logic circuit 134 provides data translation between memory format data and floating point format data similar to logic circuit 56 of FIGS. 1 and 10 and logic circuit 122 of FIG. 10. A single logic circuit 134 is used in the exemplary embodiment of FIG. 11 for translation from memory format data stored in either memory 12 or integer files 18 and floating point register format data stored in floating point register files 20.

The exemplary embodiment of FIG. 11 generally uses less area on the chip than the exemplary embodiment of FIG. 10. However, the exemplary embodiment of FIG. 10 may provide a greater performance than the exemplary embodiment of FIG. 11, since two separate logic circuits are used for the translation between the memory and the floating point processing unit and between the integer processing unit and the floating point processing unit.

What is claimed is:

1. An apparatus for directly transferring and translating data between an integer processing unit and a floating point processing unit comprising:
   an integer register file storing data in a first format;
   a floating point register file storing data in a second format, said second format being different from said first format; and
   a direct data link between said integer register file and said floating point register file, said direct data link including a logic circuit translating data between said first format and said second format.

2. An apparatus as claimed in claim 1, wherein said first format is a memory format and said second format is a floating point format.

3. An apparatus as claimed in claim 2, wherein said memory format represents data using a first bit length and said floating point format represents data using a second bit length, wherein said second bit length is larger than said first bit length.

4. An apparatus as claimed in claim 2, wherein said integer processing unit and said floating point processing unit are each coupled to a memory storing data in a memory format, and wherein said logic circuit is additionally coupled between said floating point register file and said memory.

5. An apparatus as claimed in claim 2, wherein an additional logic circuit is coupled to the floating point register file, and adapted for coupling to a memory storing data in a memory format, said additional logic circuit translating data between said memory format and said floating point format.

6. An apparatus as claimed in claim 2, wherein said memory format includes at least one of a single precision memory format and a double precision memory format.

7. An apparatus as claimed in claim 1, wherein said apparatus is included in a processor utilized for performing integer calculations and floating point calculations.

8. An apparatus as claimed in claim 1, wherein said first format represents data using a first bit length and said second format represents data using a second bit length, wherein said second bit length is different than said first bit length.

9. An apparatus as claimed in claim 1, wherein integer registers included in said integer register file are 64 bits in length and floating point registers included in said floating point register file are 82 bits in length.

10. A processor performing integer calculations and floating point calculations comprising:
    an integer processing unit including an integer register file storing data in a memory format;
    a floating point processing unit including a floating point register file storing data in a floating point format; and
    a direct data link between said integer register file and said floating point register file, said direct data link including a logic circuit translating data between said memory format and said floating point format.

11. A processor according to claim 10, wherein said integer processing unit and said floating point processing unit are each coupled to a memory storing data in a memory format, and wherein said logic circuit is additionally coupled between said floating point register file and said memory.

12. A processor according to claim 10, wherein an additional logic circuit is coupled to the floating point register file, and adopted for coupling to a memory storing data in a memory format, said additional logic circuit translating data between said memory format and said floating point format.

13. A computer system including a processor performing integer and floating point calculations, said processor comprising:
    an integer processing unit including an integer register file storing data in a memory format;
    a floating point processing unit including a floating point register file storing data in a floating point format; and
    a direct data link between said integer register file and said floating point register file, said direct data link including a logic circuit translating data between said memory format and said floating point format.

14. A computer system according to claim 13, wherein said integer processing unit and said floating point processing unit are each coupled to a memory storing data in a memory format, and wherein said logic circuit is additionally coupled between said floating point register file and said memory.

15. A computer system according to claim 13, wherein an additional logic circuit is coupled between a memory storing data in a memory format and said floating point register, said additional logic circuit translating data between said memory format and said floating point format.

16. A method of translating and directly transferring data in a memory format from an integer register of an integer processing unit to data in a floating point format in a floating point register of a floating point processing unit, comprising steps of:

transferring significand bits of said data in the memory format from a significand field of said integer register to a significand field of said floating point register;

transferring a sign of said data in the memory format from a sign field of said integer register to a sign field of said floating point register; and translating an exponent of said data in the memory format stored in an exponent field of said integer register to an exponent of said data in said floating point format stored in an exponent field of said floating point register.

17. A method according to claim 16, further comprising a step of storing predetermined zero bits in least significant bit positions of said significand field of said floating point register.

18. A method according to claim 16, further comprising steps of:

comparing the exponent stored in the exponent field of said integer register with a zero exponent value; and storing a result of said comparing step in a portion of said significand field of said floating point register.

19. A method according to claim 16, wherein said memory format is at least one of a single precision memory format and a double precision memory format.

20. A method according to claim 16, wherein said translating step comprises steps of:

adding a bias correction value to the exponent of said data in the memory format stored in the exponent field of said integer register to obtain a resultant sum; and transferring the resultant sum to the exponent field of said floating point register.

21. A method according to claim 20, wherein said bias correction value is a constant value based on a floating point bias value and a memory bias value.

22. A method according to claim 16, wherein said translating step comprises steps of:

adjusting said exponent of said data in the memory format stored in the exponent field of said integer register in response to a bias correction value and transferring a result of the adjusting to the exponent field of said floating point register.

23. A method according to claim 16, wherein said translating step comprises steps of:

if the exponent of said data in the memory format stored in the exponent field of said integer register has a value of all ones, storing a value of all ones in the exponent field of said floating point register;

if the exponent of said data in the memory format stored in the exponent field of said integer register has a value other than a value of all ones and a value other than a value of all zeros, adjusting a value of said exponent of said data in the memory format stored in the exponent field of said integer register in response to a first bias correction value and storing the adjusted value in the exponent field of said floating point register; and if the exponent of said data in the memory format stored in the exponent field of said integer register has a value of all zeros, adjusting a value of said exponent of said data in the memory format stored in the exponent field of said integer register in response to a second bias correction value and storing the adjusted value in the exponent field of said floating point register.

24. A method of translating and directly transferring data in a floating point format from a floating point register of a floating point processing unit to data in a memory format in an integer register of an integer processing unit, comprising steps of:

transferring significand bits of said data in the floating point format from a significand field of said floating point register to a significand field of said integer register;

transferring a sign of said data in the floating point format from a sign field of said floating point register to a sign field of said integer register; and translating an exponent of said data in the floating point format stored in an exponent field of said floating point register to an exponent of the data in the memory format stored in an exponent field of said integer register.

25. A method according to claim 24, further comprising a step of storing predetermined zero bits in said integer register.

26. A method according to claim 24, wherein said memory format is at least one of a single precision memory format and a double precision memory format.

27. A method according to claim 24, wherein said translating step comprises steps of:

subtracting a bias correction value from the exponent of said data in the floating point format stored in the exponent field of said floating point register to obtain a subtraction result; and transferring the subtraction result to the exponent field of said integer register.

28. A method according to claim 27, wherein said bias correction value is a constant value based on a floating point bias value and a memory bias value.

29. A method according to claim 24, wherein said translating step comprises steps of:

adjusting said exponent of said data in the floating point format stored in the exponent field of said floating point register in response to a bias correction value and transferring a result of the adjusting to the exponent field of said integer register.

30. A method according to claim 24, wherein said translating step comprises steps of:

if an explicit one bit of said data in the floating point format stored in the floating point register is a first predetermined value, storing a value of all zeros in the exponent field of said integer register;

if the explicit one bit of said data in the floating point format stored in the floating point register is a second predetermined value and the exponent of said data in the floating point format stored in the exponent field of said floating point register has a value of all ones, storing a value of all ones in the exponent field of said integer register; and if the explicit one bit of said data in the floating point format stored in the floating point register has the second predetermined value and the exponent of said data in the floating point format stored in the exponent field of said floating point register has a value other than a value of all ones, adjusting a value of said exponent of said data in the floating point format stored in the exponent field of said floating point register in response to a bias correction value and storing the adjusted value in the exponent field of said integer register.

* * * * *